(12) United States Patent
Holla et al.

(10) Patent No.: US 8,971,084 B2
(45) Date of Patent: Mar. 3, 2015

(54) CONTEXT PROTECTION FOR A COLUMN INTERLEAVED MEMORY

(71) Applicant: Texas Instruments Incorporated, Dallas, TX (US)

(72) Inventors: Lakshmikantha Holla, Bangalore (IN); Thomas Aton, Dallas, TX (US); Steve Prins, Fairview, TX (US); Dharaneedharan S, Coimbatore (IN)

(73) Assignee: Texas Instruments Incorporated, Dallas, TX (US)

( * ) Notice: Subject to any disclaimer, the term of this patent is extended or adjusted under 35 U.S.C. 154(b) by 64 days.

(21) Appl. No.: 13/948,914

(22) Filed: Jul. 23, 2013

(65) Prior Publication Data

US 2015/0029773 A1  Jan. 29, 2015

(51) Int. Cl.
*G11C 5/02* (2006.01)

(52) U.S. Cl.
CPC .................................. *G11C 5/025* (2013.01)
USPC ............................................. 365/51; 365/154

(58) Field of Classification Search
USPC ...................................................... 365/154, 51
See application file for complete search history.

(56) References Cited

U.S. PATENT DOCUMENTS

2014/0185366 A1\* 7/2014 Chandwani et al. .......... 365/154

\* cited by examiner

*Primary Examiner* — Fernando Hidalgo
(74) *Attorney, Agent, or Firm* — John R. Pessetto; Frederick J. Telecky, Jr.

(57) ABSTRACT

A semiconductor memory cell includes a set of circuit structures, each having column input/output circuits. The semiconductor memory cell further includes a set of replicas corresponding to the column input/output circuits. The set of replicas are non-functional and fills an empty space next to the column input/output circuits and hence, provides context protection for the column input/output circuits.

16 Claims, 5 Drawing Sheets

US 8,971,084 B2

CONTEXT PROTECTION FOR A COLUMN INTERLEAVED MEMORY

TECHNICAL FIELD

Embodiments of the disclosure relate to semiconductor memories and specifically to context protection in column interleaved memories.

BACKGROUND

Memory compilers use a concept called bit interleaving or MUX factors to improve immunity to soft error rate (SER). Bit interleaving is also used to provide multiple aspect ratio options for a given configuration of memory. Bit interleaving includes physical organization of a memory; i.e. an 8 word by 4 bit memory can be physically organized as MUX1 or MUX2 or MUX4. Further, through bit interleaving the memory can provide similar access to all words of the memory access and simultaneously provide multiple floor-plan options. For example, in a MUX4, the bits of a word "a" are interleaved with bits of a word "b", "c" and "d". This method of memory build encourages re-use of common circuits between the different MUX options.

The circuits used in different MUX factors only differ in placement of the cells. Physical layouts created for memory periphery created for one MUX factor are typically re-used for other MUX factors. This saves time in creating multiple layouts for the same circuits. The memory periphery circuits are pitch matched to the bit cell dimensions to ensure best overall area usage of the memory, re-use of layout cells and reduction in engineering efforts. Hence, circuits like sense amplifier, write driver, pre-charge, input latches and other COLUMN I/O circuits are aligned to one dimension of the bit cell and grow only in the tangential dimension.

Due to requirement of pitch matching to the bit cell dimensions, when a MUX2 is converted to a MUX4, the sense-amplifier and other COLUMN I/O circuits continue to be common to the set of 2 or 4 set of bits in a given column (based on MUX factor of 2 or 4). But it creates an additional space next to them in higher MUX factor implementations. The empty space next to a sense amplifier and other COLUMN I/O circuits causes unpredictable context next to the COLUMN I/O circuits. Context effects impact propagation delay of functional transistors from 5-18% depending on the circuit and context combination. Therefore, the unpredictable context leads to unknown timing for each circuit.

SUMMARY

An example embodiment provides a semiconductor memory cell that includes a set of circuit structures. Each circuit structure further includes a column input/output circuit and a set of replicas that are non-functional, corresponding to the column input/output circuits. The set of replicas is configured to fill an empty space next to the column input/output circuits. The set of replicas provide context protection for the column input/output circuits.

Another example embodiment provides a semiconductor memory layout including a memory cell array. The memory cell array includes a plurality of semiconductor memory cells arranged in rows and columns. A plurality of bit lines are coupled to the semiconductor memory cells arranged in columns and a plurality of word lines are coupled to the semiconductor memory cells arranged in rows. The semiconductor memory cells include a set of circuit structures. Each circuit structure further includes a column input/output circuit and a set of replicas that are non-functional, corresponding to the column input/output circuits. The set of replicas is configured to fill an empty space next to the column input/output circuits. The set of replicas provide context protection for the column input/output circuits.

An example embodiment provides a method for providing context protection in a semiconductor memory cell. The method includes creating column input/output circuits for a given MUX factor during memory build. Then, the column input/output circuits are reused across a higher MUX factor. A set of replicas, of the column input/output circuits, is created in an empty space, where the empty space is created by reusing the column input/output circuits for higher MUX factors. The set of replicas is inactivated to provide context protection for the column input/output circuits.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
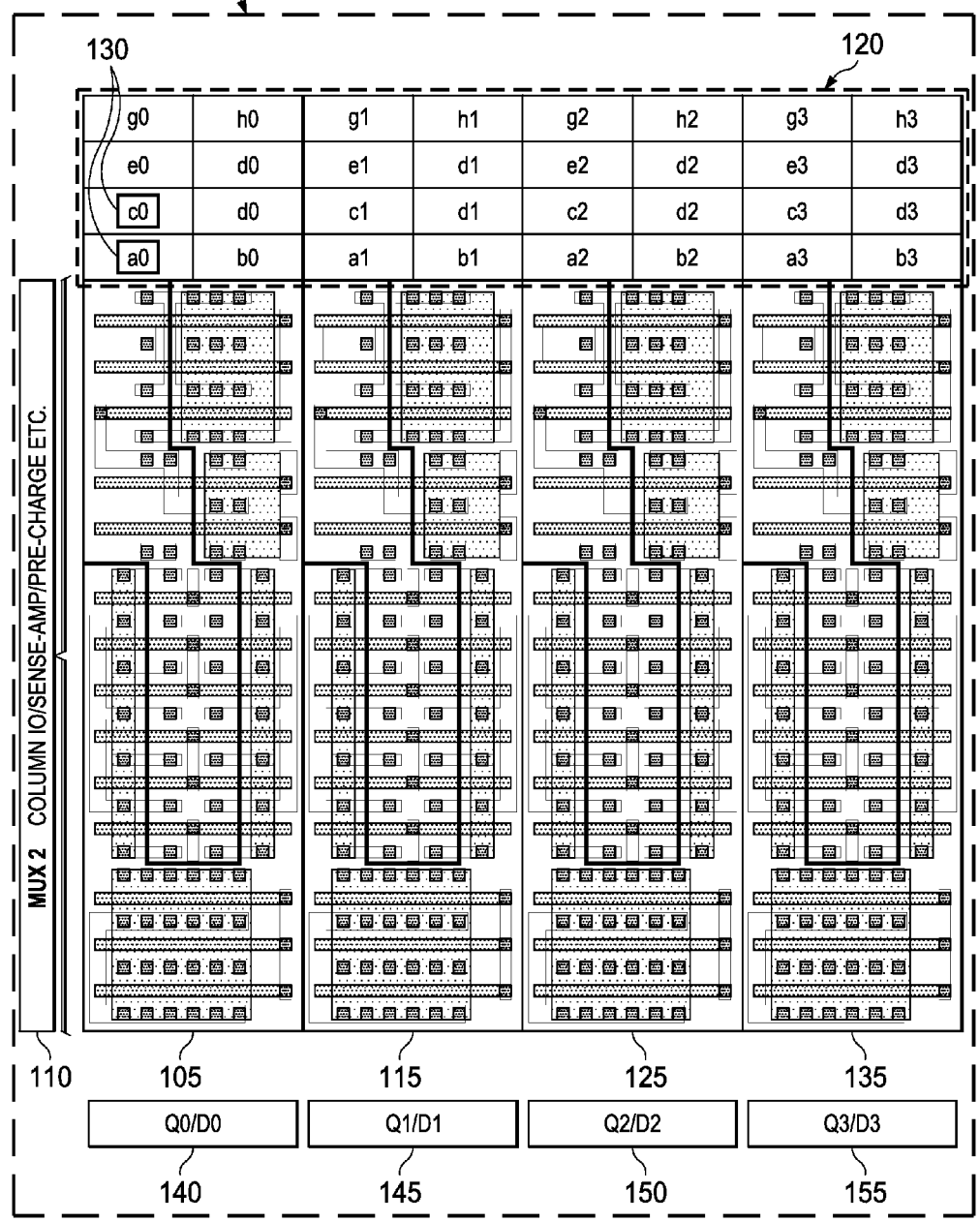
FIG. 1 illustrates a schematic of MUX 2 implementation of a semiconductor memory cell.

FIG. 1 illustrates a schematic of MUX 2 (MUX factor 2) implementation of a column interleaved, semiconductor memory cell 100. The FIG. 1 also illustrates various layers of the semiconductor memory cell 100 along with the connections. The semiconductor memory cell 100 includes a set of circuit structures or memory periphery circuits. Each circuit structure includes column input/output circuits (COLIO 110). The column input/output circuits 110 include any one of, but not limited to, a sense amplifier, a set of input/output latches, a set of input/output drivers and a pre-charge circuit. The column input/output circuits 110 are implemented on the semiconductor memory cell 100 in the blocks 105, 115, 125 and 135. The semiconductor memory cell 100 also includes bit cells 130 that are column interleaved and are arranged in a bit array 120. Each bit cell 130 has two operating states i.e. two binary values '0' and '1'. The bit cells 130 are used to write input (D0, D1, D2 and D3) or to read output (Q0, Q1, Q2 and Q3) as shown in blocks 140, 145, 150, and 155 respectively. The column input/output circuits 110 are pitch matched to the bit cells 130 such that the column input/output circuits 110 are aligned to one dimension of the bit cell 130. Therefore, the column input/output circuits 110 grow only in tangential dimension. In semiconductor memory layouts, a lower MUX factor is converted to a higher MUX factor which is further illustrated in FIG. 2.

Figure 2:
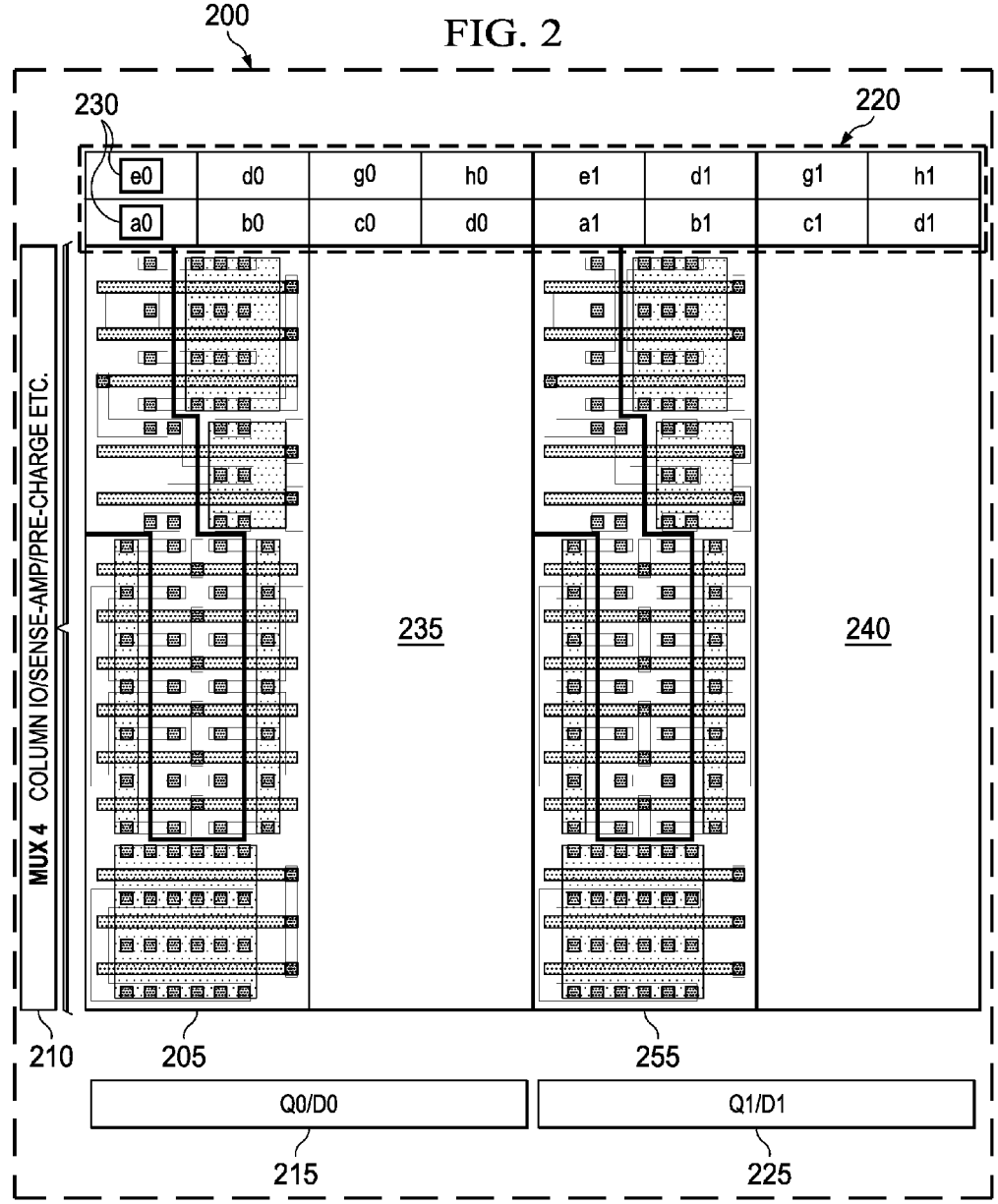
FIG. 2 illustrates a schematic of MUX 4 implementation of the semiconductor memory cell shown in FIG. 1.

FIG. 2 illustrates a schematic of MUX 4 implementation in a semiconductor memory cell 200. It is noted that the MUX2 in FIG. 1 is converted to a MUX 4 in FIG. 2. The semiconductor memory cell 200 includes a set of circuit structures or memory periphery circuits. Each circuit structure includes column input output circuits 210. The column input/output circuits 210 include any one of a sense amplifier, a set of input/output latches, a set of input/output drivers and a pre-charge circuit. The column input/output circuits 210 are implemented in blocks 205 and 255. The semiconductor memory cell 200 includes bit cells 230 that are column interleaved and are arranged in an array 220. Each bit cell 230 has two operating states i.e. two binary values '0' and '1'; and is used for write input (D0 and D1) or for read output (Q0 and Q1) shown in blocks 215 and 225 respectively.

The same column input/output circuits 110 illustrated in FIG. 1 are re-used as column input/output circuits 210 in the MUX 4 implementation in order to save time consumed in creating multiple layouts for the same circuits. The column input/output circuits 210 are pitch matched to the bit cell 230 dimensions to ensure that the best overall area of the memory is used and also to reduce engineering efforts. Hence, the circuits like sense amplifier, pre-charge and input latches are aligned to one dimension of the bit cell 230 and grow only in the tangential dimension. Since the same column input/output circuits are used for MUX 2 and MUX 4 implementation, an empty space 235 is created due to bit interleaving. The empty space 235 is created adjacent to the block 205, similar to an empty space 240 created adjacent to the block 255.

As a result of the empty space 235 and 240, the column input/output circuits 210 in blocks 205 and 255 experience different context effect as compared to the context effect experienced in the MUX 2 implementation of FIG. 1. Further, the empty space 235 and 240 is filled with a dummy fill by top level software, which leads to unpredictability in the context effect. This unpredictable context leads to unknown timing in the memory cell 200. The issue of unpredictable context effect can be reduced if a right context is place next to the column input/output circuits 210 in the empty space 235 and 240. For example, for an NMOS transistor, a dummy active at a minimum spacing must be placed, and for a PMOS transistor an NWELL may be placed. But the process is iterative and time consuming, leading to high engineering efforts. Moreover, this does not guarantee that the context seen by the column input/output circuits 210 in blocks 205 and 255 is matched completely in other MUX factors. Hence, there exists a need to ensure context protection for the column input/output circuits 210 in blocks 205 and 255 in all MUX factors without requiring high engineering effort.

Figure 3:
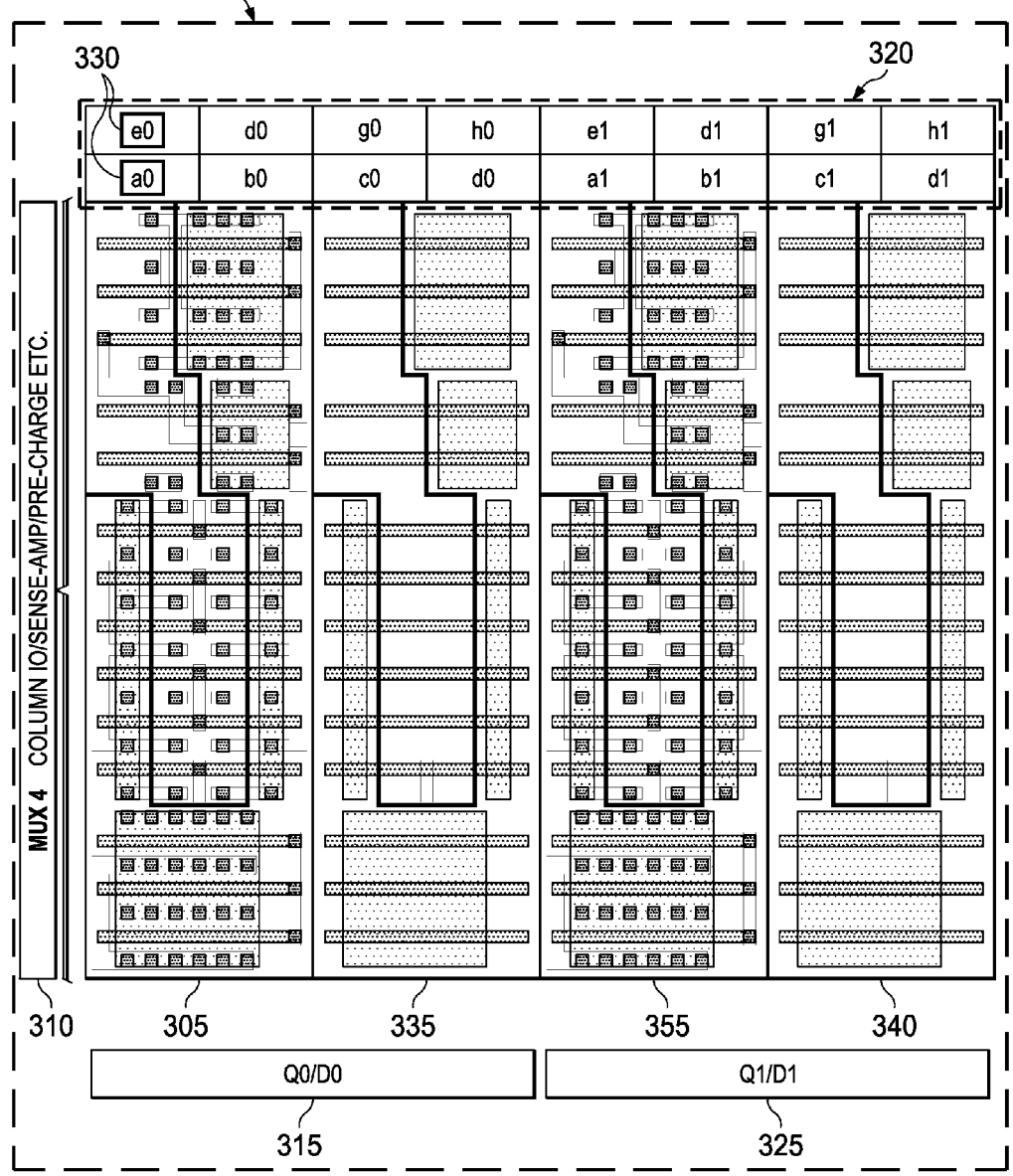
FIG. 3 illustrates a schematic of MUX 4 implementation in a semiconductor memory cell according to an embodiment.

FIG. 3 illustrates a schematic of MUX 4 implementation in a semiconductor memory cell 300 according to an embodiment. The MUX2 in FIG. 1 is converted to a MUX 4 in the semiconductor memory cells 300, therefore, the same circuit structures are shown in FIG. 3. The semiconductor memory cell 300 includes a set of circuit structures or memory periphery circuits. Each circuit structure includes column input/output circuits 310. In one embodiment, the column input/output circuits 310 include any one of a sense amplifier, a set of input/output latches, a set of input/output drivers and a pre-charge circuit. The column input/output circuits 310 are implemented on the semiconductor memory cell 300 in the blocks 305 and 355. The semiconductor memory cell 300 also includes bit cells 330 that are column interleaved and are arranged in a bit array 320. Each bit cell 330 has two operating states i.e. two binary values '0' and '1'; and is used for write input (D0 and D1) or for read output (Q0 and Q1) shown in blocks 315 and 325 respectively.

Since the same column input/output circuits 110 illustrated in FIG. 1 are re-used as column input/output circuits 310 in the MUX 4 implementation, an empty space is created in the blocks adjacent to 305 and 355. A set of replicas 335 and 340 corresponding to the column input/output circuits 310 in the blocks 305 and 355 are placed adjacent to the blocks 305 and 355 respectively. The set of replicas 335 and 340 are non-functional, comprising of the NWELL and PWELL regions, diffusion layer of the column input/output circuits 310 in the blocks 305 and 355; but without the metal connections and the respective poly contacts. Since the set of replicas 335 and 340 have the same context as that of the column input/output circuits 310 in the blocks 305 and 355, they provide identical context effects to the column input/output circuits 310 in blocks 305 and 355 thereby reducing unpredictable proximity effect. The set of replicas 335 and 340 are not used as dummy fill. This ensures identical context effect that provides context protection for the column input/output circuits 310 in blocks 305 and 355, for all MUX factors.

Thus from the operation of the memory cell 300, it is evident that the proposed embodiment provides the same context in all MUX implementations. As the functional circuit i.e. the circuit structures 310 in blocks 305 and 355 see the identical non-functional circuit i.e. the replicas 335 and 340 a predictable context effect is seen. Thus, there is significant reduction in the unpredictability of the context effect seen as compared to the semiconductor memory cell 200 where the empty space 235 and 240 is filled with a known context. Further, in addition to the context protection provided for the set of circuit structures 310 in blocks 305 and 355, the proposed embodiment is neither iterative nor time consuming and does not require high engineering efforts.

Figure 4:
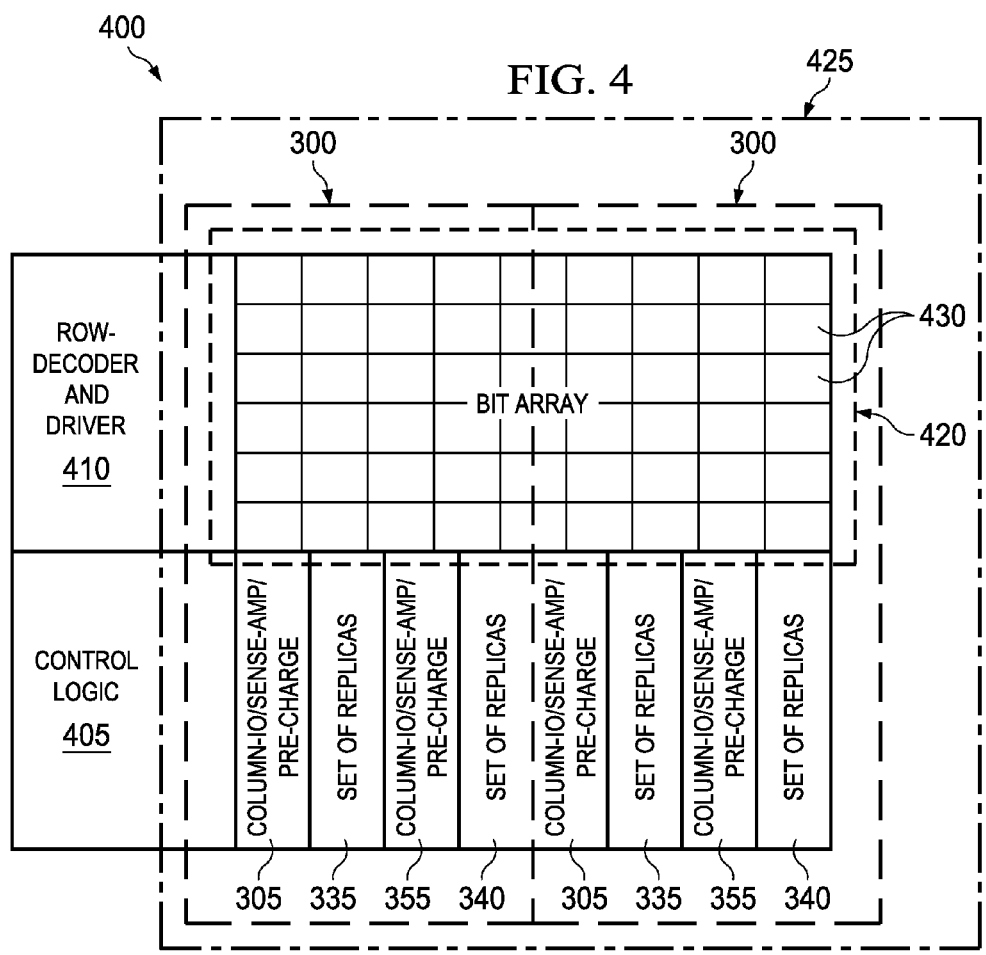
FIG. 4 illustrates an SRAM with semiconductor memory cells according to another embodiment.

FIG. 4 illustrates a static random access memory (SRAM) with semiconductor memory cells 300 according to another embodiment. The SRAM is a column interleaved memory 400 and includes a memory cell array 425 and a control logic block 405. In various embodiments, the column interleaved memory 400 is implemented as one of, but not limited to, an SRAM, a blocked SRAM and a butterfly blocked SRAM. The column interleaved memory 400 further includes one of row decoders and drivers 410. The memory cell array 425 includes a plurality of semiconductor memory cells 300 arranged in rows and columns. The semiconductor memory cell array 425 also includes bit cells 430 that are column interleaved and are arranged in a bit array 420. A plurality of bit lines is coupled to the semiconductor memory cells 300 arranged in columns and a plurality of word lines coupled to the semiconductor memory cells 300 arranged in rows. The MUX 2 in FIG. 1 is converted to a MUX 4 in the semiconductor memory cells 300 and the same semiconductor memory cells 300 are shown in FIG. 4. The semiconductor memory cell 300 includes a set of circuit structures. The set of circuit structures includes column input/output circuits 310 in blocks 305 and 355. The column input/output circuits 310 are associated with one of the plurality of bit lines. The column input/output circuits 310 can also be implemented on anyone of a blocked SRAM and a butterfly blocked SRAM. The column input/output circuits 310 include one of a sense amplifier, a set of input/output latches, a set of input/output drivers and a pre-charge circuit.

The semiconductor memory cells 300 further includes a set of replicas 335 and 340 of the column input/output circuits 310. The replicas 335 and 340 are non-functional and in close proximity to the column input/output circuits 310. The set of replicas 335 and 340 fills an empty space next to the column input/output circuits 310 in the blocks 305 and 355. The empty space is created since MUX 2 for the semiconductor memory cell is reused for MUX 4 in the semiconductor memory cell 300. The set of replicas 335 and 340 are non-functional, comprising of the NWELL and PWELL regions, diffusion layer of the column input/output circuits 110 in the blocks 305 and 355, but having the metal connections and the poly contacts removed. Since the set of replicas 335 and 340 have the same context as that of the column input/output circuits 310 in the blocks 305 and 355, they provide identical context effects to the column input/output circuits 310 thereby reducing unpredictable proximity effect. The set of replicas 335 and 340 are not used as a dummy fill. This ensures identical context effect that provides context protection for the column input/output circuits 310 in blocks 305 and 355, for all MUX factors.

The SRAM layout includes several of such semiconductor memory cells 300; therefore there is a significant improvement in the timing of the SRAM as the known context of the set of replicas 335 and 340 reduces the unpredictable proximity effect. Further, the proposed semiconductor memory cells 300 are re-usable for all MUX implementations thereby increasing the robustness of the SRAM considerably. Additionally, the improvements seen in timing and robustness are achieved without unduly consuming time and engineering effort.

Figure 5:
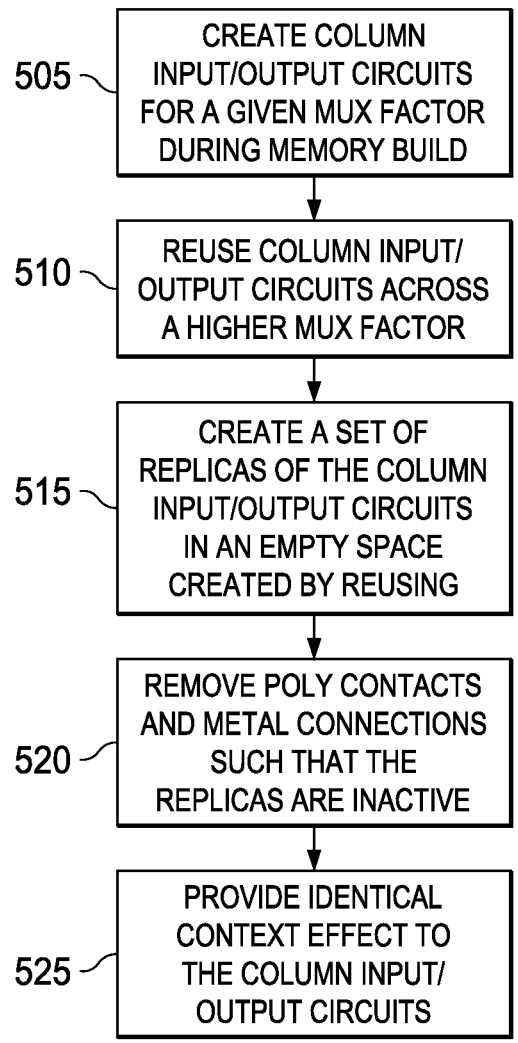
FIG. 5 is a flowchart of the method for providing context protection in a semiconductor memory cell according to an embodiment.

FIG. 5 is a flowchart of the method for providing context protection in a semiconductor memory cell 300 illustrated in FIG. 3, according to an embodiment. At step 505, the column input/output circuits 310 are created for a given MUX factor, for example MUX 2 implementation, during memory build. At step 515, the column input/output circuits 310 are reused across a higher MUX factor, for example MUX 4 per the requirement. Reusing the column input/output circuits an empty space is created adjacent to the blocks for example, blocks 305 and 355 of the column input/output circuits 310 shown in FIG. 3. At step 515, a set of replicas of the column input/output circuits 310 are created in the empty space for example 335 and 340 in FIG. 3. Then at step 520, poly contacts and metal connections of the set of replicas are removed such that the set of replicas are inactive (non-functional). It is noted that the set of replicas are not used as a dummy fill. This ensures identical context effect providing context protection for the column input/output circuits 310 in blocks 305 and 355 for all MUX factors at step 525. Since, the set of replicas for example 335 and 340 have the same context as that of the column input/output circuits 310 in the blocks for example blocks 305 and 355, they provide identical context effects to the column input/output circuits 310 thereby reducing unpredictable proximity effect.

In the foregoing discussion, the term "connected" means at least either a direct electrical connection between the devices connected or an indirect connection through one or more passive or active intermediary devices. The term "circuit" means at least either a single component or a multiplicity of components, either active or passive, that are connected together to provide a desired function. The term "signal" means at least one current, voltage, charge, data, or other signal. It is to be understood that the term transistor can refer to devices including MOSFET, PMOS, and NMOS transistors. Furthermore, the term transistor can refer to any array of transistor devices arranged to act as a single transistor.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A semiconductor memory cell comprising:
   a set of circuit structures, each comprising column input/output circuits; and
   a set of replicas, that are non-functional, corresponding to the column input/output circuits, the set of replicas configured to fill an empty space next to the column input/output circuits, wherein the set of replicas provide context protection for the column input/output circuits.

2. The semiconductor memory cell of claim 1, wherein the column input/output circuits comprises one of a sense amplifier, a set of input/output latches and a set of input/output drivers.

3. The semiconductor memory cell of claim 1, wherein the empty space is created when a given MUX factor for the semiconductor memory cell is reused for a higher MUX factor.

4. The semiconductor memory cell of claim 1, wherein each replica of the set of replicas is configured to fill the empty space of the corresponding column input/output circuit.

5. The semiconductor memory cell of claim 1, wherein each replica of the set of replicas provides identical context effects to the corresponding column input/output circuit that reduces unpredictable proximity effect for all MUX factors.

6. The semiconductor memory cell of claim 1, wherein each of the set of replicas is configured to be non-functional by removing respective poly contacts and metal connections.

7. A semiconductor memory layout comprising:
   a memory cell array having a plurality of semiconductor memory cells being arranged in rows and columns;
   a plurality of bit lines coupled to the semiconductor memory cells arranged in columns and a plurality of word lines coupled to the semiconductor memory cells arranged in rows;
   a set of circuit structures, each comprising column input/output circuits; and
   a set of replicas, that are non-functional, corresponding to the column input/output circuits, the set of replicas configured to fill an empty space next to the column input/output circuits, wherein the set of replicas provide context protection for the column input/output circuits.

8. The semiconductor memory layout of claim 7 is implemented on a column interleaved memory that is one of a standard static random access memory (SRAM), a blocked SRAM and a butterfly blocked SRAM.

9. The semiconductor memory layout of claim 7, wherein the column input/output circuits comprises one of a sense amplifier, a set of input/output latches and a set of input/output drivers.

10. The semiconductor memory layout of claim 7, wherein the empty space is created when a given MUX factor for the semiconductor memory cell is reused for a higher MUX factor.

11. The semiconductor memory cell of claim 7, wherein each replica of the one or more replicas is configured to fill the empty space of the corresponding column input/output circuit that provides identical context effects to the column input/output circuit, thereby reducing unpredictable proximity effect.

12. The semiconductor memory layout of claim 7, wherein each of the set of replicas is configured to be non-functional by removing respective poly contacts and metal connections.

13. A method for providing context protection in a semiconductor memory cell, the method comprising:
   creating column input/output circuits for a given MUX factor during memory build;
   reusing column input/output circuits across a higher MUX factor;

creating a set of replicas of the column input/output circuits in an empty space, the empty space being created by reusing column input/output circuits; and inactivating the set of replicas such that context protection is provided for the column input/output circuits.

14. The method of claim 13, wherein creating a set of replicas further comprises providing identical context effect to the column input/output circuits, thereby reducing the unpredictable proximity effect of the empty space.

15. The method of claim 13, wherein inactivating the set of replicas comprises:

removing poly contacts and metal connections of the set of replicas.

16. The method of claim 13, wherein the column input/output circuits comprises one of a sense amplifier, a set of input/output latches and a set of input/output drivers.

* * * * *